(12) United States Patent
Baumgartner et al.

(10) Patent No.: US 8,394,696 B2
(45) Date of Patent: Mar. 12, 2013

(54) SEMICONDUCTOR DEVICE WITH REDUCED CAPACITANCE TOLERANCE VALUE

(75) Inventors: Peter Baumgartner, Munich (DE); Philipp Riess, Munich (DE); Thomas Benetik, Munich (DE)

(73) Assignee: Infineon Technologies AG, Neubiberg (DE)

( * ) Notice: Subject to any disclaimer, the term of this patent is extended or adjusted under 35 U.S.C. 154(b) by 0 days.

(21) Appl. No.: 12/971,520

(22) Filed: Dec. 17, 2010

(65) Prior Publication Data

US 2011/0086487 A1    Apr. 14, 2011

Related U.S. Application Data

(63) Continuation of application No. 11/775,086, filed on Jul. 9, 2007, now abandoned.

(51) Int. Cl.
*H01L 51/05* (2006.01)
(52) U.S. Cl. ............... 438/239; 438/171; 438/244
(58) Field of Classification Search .......... 438/171, 438/190, 210, 238, 239, 244, 250, 253, 329, 438/379, 381, 387, 393, 396, 44; 257/306, 257/307, E27.034, E27.092, E21.035
See application file for complete search history.

(56) References Cited

U.S. PATENT DOCUMENTS

| | | | |
|---|---|---|---|
| 4,825,268 A * | 4/1989 | Oowaki | 257/297 |
| 6,680,521 B1 | 1/2004 | Kar-Roy et al. | |
| 7,615,440 B2 * | 11/2009 | Felsner et al. | 438/240 |
| 2002/0093780 A1 | 7/2002 | Hajimiri et al. | |
| 2004/0152258 A1 | 8/2004 | Kiyotoshi | |
| 2005/0261797 A1 * | 11/2005 | Cyr et al. | 700/121 |
| 2006/0097580 A1 | 5/2006 | Fischer et al. | |
| 2006/0097747 A1 * | 5/2006 | Amin | 326/6 |
| 2007/0045710 A1 * | 3/2007 | Riekels et al. | 257/315 |
| 2007/0079488 A1 * | 4/2007 | Kim et al. | 29/25.01 |
| 2007/0102745 A1 | 5/2007 | Hsu et al. | |
| 2007/0152295 A1 * | 7/2007 | Yeh et al. | 257/516 |
| 2007/0202656 A1 | 8/2007 | Park et al. | |
| 2007/0232014 A1 | 10/2007 | Larsen et al. | |
| 2007/0253144 A1 * | 11/2007 | Kuwajima | 361/311 |
| 2007/0267673 A1 * | 11/2007 | Kim et al. | 257/303 |

* cited by examiner

*Primary Examiner* — Cuong Q Nguyen
*Assistant Examiner* — Yosef Gebreyesus
(74) *Attorney, Agent, or Firm* — Slater & Matsil, L.L.P.

(57) ABSTRACT

A semiconductor device includes a capacitance, the numerical value of which is relevant for a device function. The capacitance is formed from a parallel connection of at least a first and a second capacitor element, wherein the first and second capacitor elements are formed in respective manufacturing steps that exhibit uncorrelated process fluctuations.

15 Claims, 4 Drawing Sheets

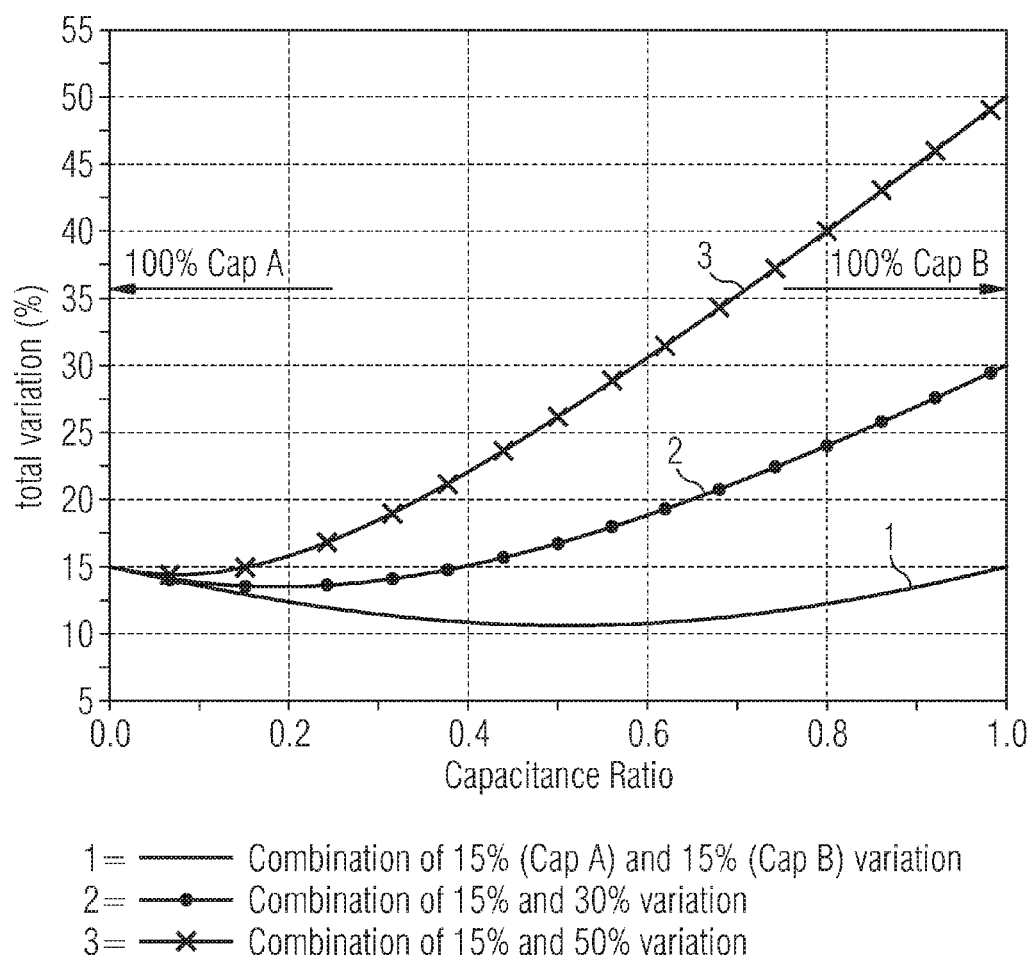

SEMICONDUCTOR DEVICE WITH REDUCED CAPACITANCE TOLERANCE VALUE

This is a continuation application of U.S. application Ser. No. 11/775,086, entitled "A Semiconductor Device with Reduced Capacitance Tolerance Value," which was filed on Jul. 9, 2007 now abandoned and is hereby incorporated herein by reference in its entirety.

TECHNICAL FIELD

The present invention relates to a semiconductor device that includes a capacitance, such as an analog/digital converter device or filter device, a device function of which is significantly influenced by a numerical value of the capacitance.

BACKGROUND

The device functions of semiconductor devices are significantly influenced by the numerical value of inherent capacitive elements, which numerical values are influenced by process parameters of respective manufacturing steps of the semiconductor device that result in the formation of those capacitive elements. Therefore, in such semiconductor devices, the device function may significantly depend on process parameter fluctuations that are difficult to control in a sufficiently precise manner.

A first type of capacitor element that may be relevant is a MOS capacitor element originating from the formation of a MOS (metal-oxide-semiconductor) structure in the manufacture of an MOS-type semiconductor element. In particular, the exact thickness of an oxide layer arranged on a semiconductor substrate and underlying a subsequently deposited metal layer significantly determines the capacitance value of a capacitor element of this type.

A second relevant type of capacitor element is a so-called MIM capacitor element, which is a specifically designed capacitor element, formed from a dedicated dielectric layer and metal layer. These layers are formed in the so-called BEOL (back-end-off-line) process for electrically connecting the respective transistor and resistor elements that beforehand were produced in the so-called FEOL(front-and-off-line) process.

A third type of relevant capacitor element is formed by using existing wiring layers, e.g., VPP structures, GRID structures or sandwich structures.

For all of these above mentioned capacitor elements, the respective process steps result in a typical fluctuation of the capacitance value of not less than 15%. However, for semiconductor elements the function of which is significantly determined by the capacitance value of such capacitor elements, a fluctuation value of the linear capacitance should be as low as about 10%.

SUMMARY OF THE INVENTION

In one aspect the present invention provides a semiconductor device that includes a functionally significant capacitance, wherein the process-determined tolerance (fluctuation) of the capacitance value is reduced, to result in an improved device function or device reliability, respectively, achieved at low cost.

In an embodiment of the invention, the relevant capacitance of the semiconductor device comprises a parallel connection of at least a first and a second capacitor element, wherein the first and second capacitor elements are formed in respective manufacturing steps that exhibit uncorrelated process fluctuations. In particular, more than two capacitor elements may be connected in parallel, each of the more than two capacitor elements having a respective capacitance value that selected such that a total tolerance value of the resulting function-determining capacitance is minimized.

In a further embodiment, a first capacitance value of the first capacitor element and a second capacitance value of the second capacitor element, to obtain a predetermined total capacitance value, are selected such that a process tolerance of the capacitance is minimized. In particular, if the first process tolerance value is equal to the second process tolerance value, the first capacitance value is selected equal to the second capacitance value.

In an embodiment of the invention, the respective first and second and, if provided, further capacitor elements, are of different types, in so far as they result from different manufacturing steps, i.e., an FEOL step on the one hand and a BEOL step on the other. In particular, one of the capacitor elements may be a MOS element, whereas another one is a BEOL capacitor element of the VPP or GRID, or sandwich type. Further, in particular the first capacitor element may be a MIM capacitor element, whereas another capacitor element is of the VPP or GRID, or sandwich type, i.e., of a type which is derived from the usual wiring structure of the semiconductor device, not specifically dedicated to provide a capacitance for an analog or mixed signal or radio frequency processing purpose.

In a further embodiment, the capacitor elements contributing to the total capacitance of the device may be basically of the same type but, contain different types of dielectric layers. For example, all or part of them may be MIM capacitor elements containing several types of dielectric layers.

In a further embodiment, all of the capacitor elements may be provided at the BEOL but, be of the GRID type on the one hand and the VPP type on the other.

In a further embodiment, all or at least part of the several capacitor elements forming the total capacitance may be MOS capacitor elements but, contain different types of oxide layers.

Furthermore, in an embodiment of the invention the above mentioned combinations of capacitor elements being formed in different process steps or capacitor elements being formed basically at the same process stage but, with different dielectric materials or oxides, respectively, may be combined with each other in sophisticated multi-capacitor semiconductor devices with essentially reduced total capacitance value fluctuation.

In a further embodiment of the invention, the semiconductor device comprising a voltage controlled oscillator wherein, the numerical value of the capacitance determines the oscillator frequency. In a further embodiment, the device comprises an analog/digital converter wherein, the numerical value of the capacitance determines the convertal characteristics. Furthermore, another semiconductor device of an embodiment of the invention comprises a filter portion wherein, the numerical value of the capacitance determines a filter characteristic. In all these devices and further semiconductor devices for analog or mixed-signal processing or radio frequency devices may, in accordance with the respective manufacturing process steps, the above embodiments be applied, to adequately connect several capacitor elements with the purpose to reduce the process tolerance of the total capacitance.

BRIEF DESCRIPTION OF THE DRAWINGS

Embodiments of the present invention will now be described by way of example with reference to the accompanying drawings.

FIG. 1 shows a graph illustrating the advantageous effect of the invention;

DETAILED DESCRIPTION OF ILLUSTRATIVE EMBODIMENTS

FIG. 1 shows three graphs 1, 2, and 3 illustrating the respective total variation of corresponding total capacitances that are formed by means of connecting uncorrelated capacitors (Cap) A and B in parallel, wherein three different assumptions are made for the variation (process tolerance) of capacitor B, as indicated near the top of the figure. For evaluating these graphs, it is assumed that the overall fluctuation may be evaluated according to a Gaussian distribution, i.e., by summing-up the squared variations of the partial capacitance values.

It is to be seen that the total variation can be improved, as compared to the variation of the "better" (first) capacitor A, even if the variation of the second capacitor B is higher than that of the first capacitor. Furthermore, it becomes clear that the total variation depends on the ratio of the value of the single capacitors, wherein the optimum capacitance ratio is dependent on the variation values of both capacitors (partial capacitances), A and B.

In this regard, for exhausting the advantages that may be achieved by the invention, it is of importance to estimate the variations or process-dependent fluctuations, respectively, of the several capacitor elements that are to be connected in parallel to form the total capacitance with an improved precision. If the assumption holds that in most of the relevant FEOL and BEOL process steps that may be used to form partial capacitances of the respective process tolerance estimates are comparable (e.g., around 15 percent), the capacitance values of all contributing capacitors connected in parallel may preferably be approximately identical (neglecting any further factors that may be significant for dimensioning the total capacitance).

FIGS. 2A to 2E show several vertical cross-sections of the metallization layer structure (VPP capacitors and MIM capacitors) of a semiconductor device, not showing those layers that belong to the so-called FEOL. In all of these figures, only the respective metal (e.g., aluminum) layers and vias of the VPP structure are shown, whereas any for the MIM capacitor the dielectric layer is shown (see the description below).

Figure 2A:
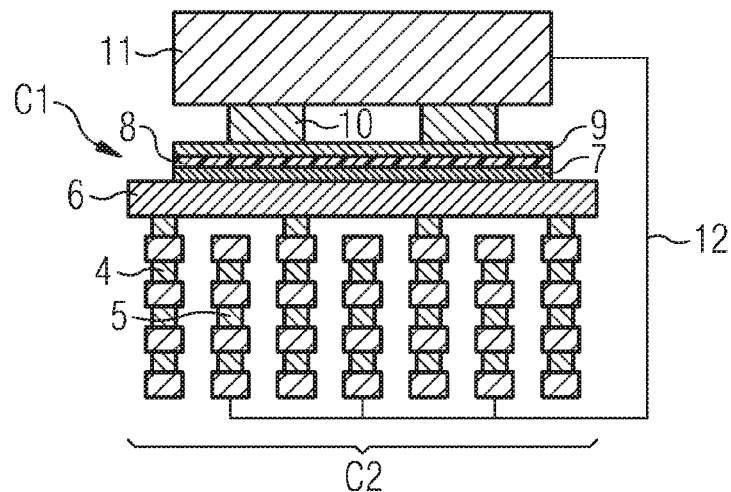
FIGS. 2A to 2E show several cross-sections of a BEOL metallization structure of a semiconductor device according to a first embodiment of the invention.
Figure 2B:
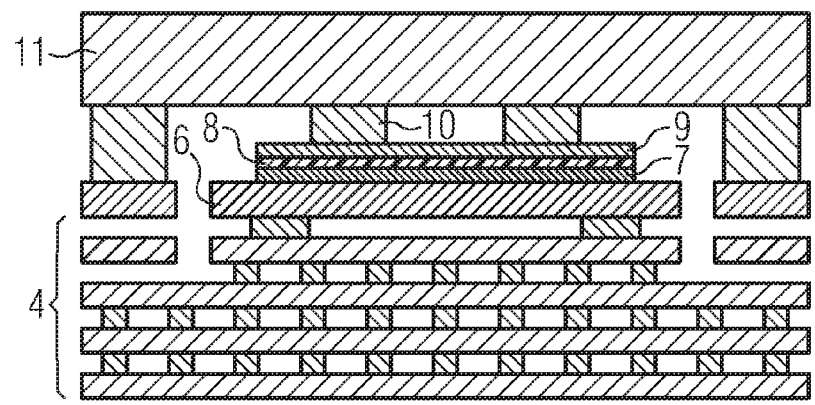
Figure 2C:
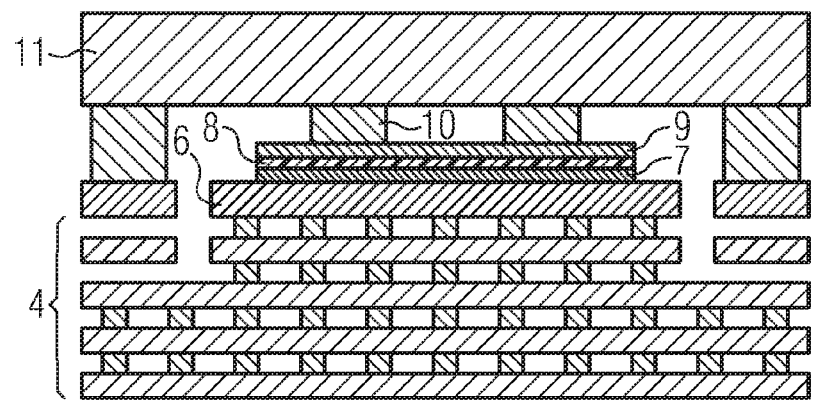
Figure 2D:
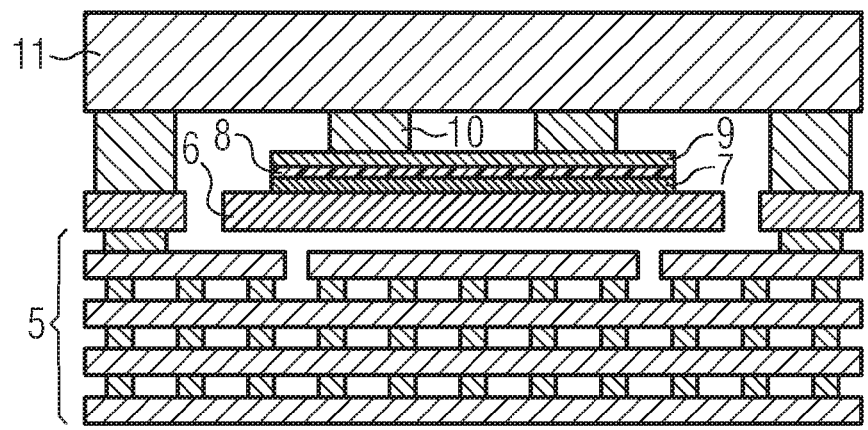
Figure 2E:
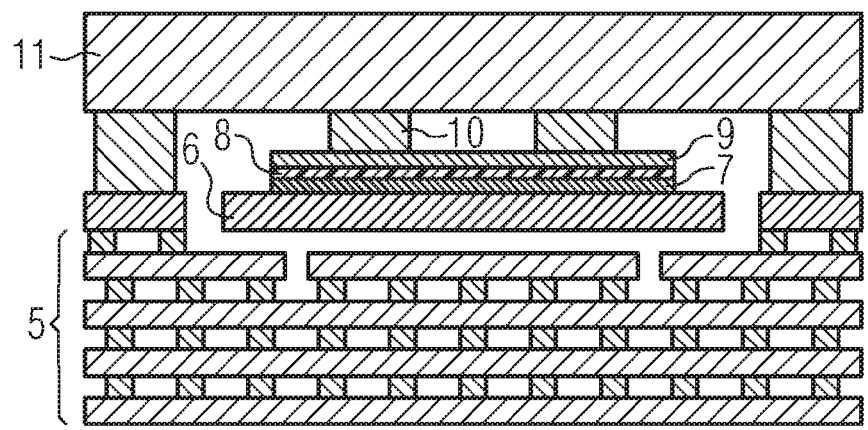
Figure 2F:
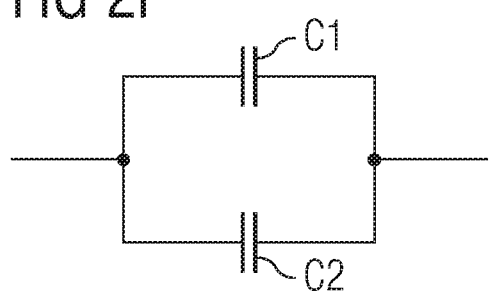
FIG. 2F is a schematic circuit diagram of the resulting total capacitance.

The BEOL structure of the semiconductor element is shown in FIG. 2A in a first vertical cross-sectional view and in FIG. 2B to 2E in further vertical cross-sectional views, in several sectional planes orthogonal to the sectional plane of FIG. 2A. The several metal layers are connected to form a parallel connection of a first capacitor C1 (MIM capacitor) and a second capacitor C2 (VPP capacitor), see especially FIGS. 2A and 2F. It is a design option of the specific layout, to adequately determine the numerical values of C1 and C2 such as to achieve the best possible reduction of the capacitance variation, i.e., the most precise total capacitance that may be realized under the given process step fluctuations of the BEOL steps.

The BEOL metallization structure comprises a basically conventional VPP capacitor structure C2 comprising alternating columns 4 or 5, respectively, of horizontally arranged and vertically stacked strip-shaped metal layers being electrically connected by comprising vias. A metal top layer 6, which is connected to the respective columns 4, in this example. On the other hand, columns 5 are connected to each other and to a superimposed second metal top layer 11 by means of an external wire connection 12 (FIG. 2A). Thus, as can best be seen in FIG. 2A, the VPP capacitor is of a basically comb-like structure of alternating, vertically aligned capacitor "plates" formed by the respective metal strip/via columns 4 and 5.

On the surface of the lower top metal layer 6, a first conductive layer is arranged, which serves as a bottom electrode 7 of the MIM capacitor C1. In one example, the top metal layer 6 is aluminum, while the conductive layer is TiN. On this lower MIM capacitor plate 7 an insulating layer 8 is provided, and thereon a second conductive layer 9 serving as a second (top) electrode of the MIM capacitor C1, is arranged. This top capacitor electrode 9 is connected to the top metal layer 11 by vias 10. Continuing with the example, the conductive layer 9 can be TiN, while the metal layer 11 and vias 10 are Al.

The details (including dimensions) of such structure, as well as the process steps for making the same are basically conventional, and therefore detailed description thereof is left out.

Figure 3A:
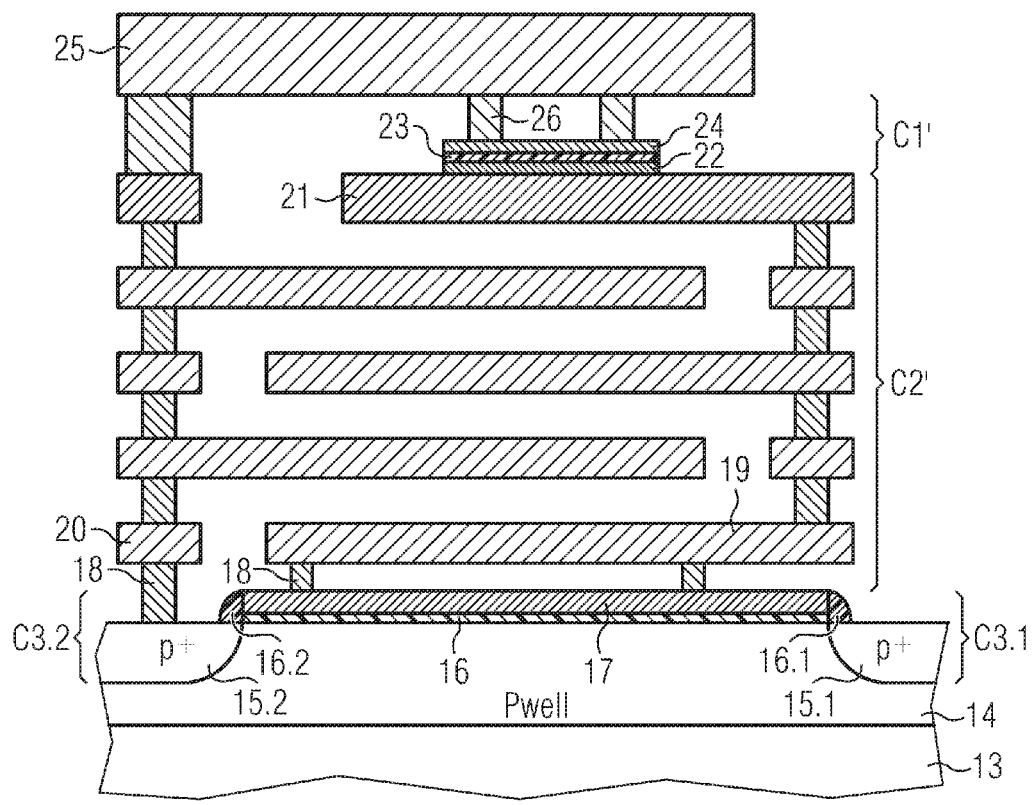
FIG. 3A shows a schematic cross-sectional illustration of a semiconductor device according to a further embodiment of the invention.
Figure 3B:
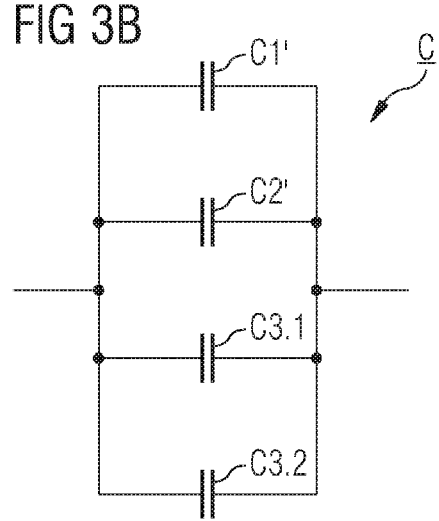
FIG. 3B is a schematic circuit diagram of the resulting total capacitance.

FIG. 3A schematically shows the layer structure of a second embodiment of the invention, in accordance with the schematic circuit diagram of FIG. 3B. This latter figure shows a parallel connection of a first capacitor C1', a second capacitor C2', and a third, and fourth capacitor C3.1 and C3.2, together forming an overall capacitance C as a function-determining capacitance C of a semiconductor device (not shown). Deviating from FIGS. 2A to 2E, FIG. 3A shows a surface portion of a semiconductor substrate 13, as well as an MOS structure provided thereon, i.e., a structure formed in a FEOL process, in addition to a BEOL structure provided thereon.

A P well 14 is provided in the surface of the semiconductor substrate 13, $p^+$ doped regions 15.1, 15.2 are provided with a predetermined distance from each other within the P well 14. On the main surface of the semiconductor substrate 13, bridging the distance between the $p^+$ regions 15.1, 15.2, an oxide layer 16 comprising side wall spacers 16.1, 16.2 is provided. A first conductive layer 17 is arranged on the oxide layer 16. This conductive layer 17 forms, with the oxide layer 16 as a dielectric layer, a first and second MOS capacitor C3.1 and C3.2 with the $p^+$ regions 15.1 and 15.2, respectively.

By means of vias 18, the MOS layer 17 is connected to a further metal layer 19 provided thereon, with an interposed dielectric layer (not specifically designated) arranged therebetween. On the other hand, a further via 18 extends from the $p^+$ region 15.2 to a further metal layer (strip) 20 provided at the same level as the metal layer 19, but electrically insulated therefrom.

In a similar manner as with the comb-like structure of the first embodiment (but with horizontally alternating "teeth" of the comb), a sandwich capacitor C2' is built by stacking a predetermined number of adequately configured metallization layers (not specifically designated). On a top metallization layer 21 of the stack, similarly to the first embodiment, an MIM capacitor C1' is formed by providing a first (bottom) TiN layer 22, followed by a dielectric layer 23, and a second (top) TiN layer 24, and connected with a top metal (aluminum) layer 25 by respective vias 26.

Like the first embodiment, the formation of the respective capacitor elements, including the sandwich capacitor C2' and the MOS capacitors C3.1 and C3.2, is basically conventional and, therefore no detailed description in this regard is necessary. However, an adequate connection is essential between the several structures or capacitor elements, respectively, by means of specifically arranged vias, to provide for the intended parallel connection of the various partial capacitances C1', C2', C3.1, and C3.2 of the total capacitance C.

What is claimed is:

1. A method of forming a semiconductor device, the method comprising:
   determining a total capacitance value for a circuit element of the semiconductor device;
   selecting a first capacitance value for a first capacitor element and a second capacitance value for a second capacitance element, wherein a parallel combination of the first capacitor element and the second capacitor element will obtain the total capacitance value;
   selecting a first process to form the first capacitor element and a second process to form the second capacitor element such that a process tolerance of the total capacitance value is lessened relative to both the first process alone and the second process alone;
   forming the first capacitor element using the first process; and
   forming the second capacitor element in parallel with the first capacitor element using the second process, the second process exhibiting uncorrelated process fluctuations with respect to the first process, wherein the first capacitor element and the second capacitor elements are fixed capacitor elements.

2. The method of claim 1, wherein selecting the first process and the second process comprises selecting the first process and the second process such that a process tolerance of the total capacitance value is minimized.

3. The method of claim 1, wherein selecting the first capacitance value and the second capacitance value further comprises selecting the first capacitance value to be equal to the second capacitance value, if the first process comprises a tolerance value equal to a tolerance value of the second process.

4. The method of claim 1, wherein:
   forming the first capacitor element comprises forming a MIM capacitor element; and
   forming the second capacitor element comprises forming a capacitor element selected from a group consisting of a MOS capacitor element and a BEOL capacitor element.

5. The method of claim 4, wherein forming the first capacitor element further comprises forming at least one aluminum or copper layer and at least one layer of a material selected from the group consisting of TiN, TaN, ONO, $SiO_2$, $Ta_2O_5$, $Al_2O_3$, and HfO.

6. The method of claim 1, wherein:
   forming the first capacitor element comprises forming a MIM capacitor element having a first type of dielectric layer; and
   forming the second capacitor element comprises forming a MIM capacitor element having a second type of dielectric layer.

7. The method of claim 1, wherein:
   forming the first capacitor element comprises forming a MOS capacitor element containing a first type of oxide layer; and
   forming the second capacitor element comprises forming an MOS capacitor element containing a second type of oxide layer.

8. The method of claim 1, further comprising:
   selecting at least one further capacitance value for at least one further capacitor element such a parallel combination of the first capacitor element, the second capacitor element and the at least one further capacitance value will obtain the total capacitance value the circuit element of the semiconductor device;
   selecting at least one further process to form the at least one further capacitor element such that a process tolerance of the total capacitance value is lessened relative to the first process alone, the second process alone, and the at least one further process alone; and
   forming the at least one further capacitor element in parallel with the first capacitor element and the second capacitor element using the at least one further process, the at least one further process exhibiting uncorrelated process fluctuations with respect to the first and second processes.

9. The method of claim 8, wherein:
   forming the first capacitor element comprises forming a MIM capacitor element;
   forming the second capacitor element comprises forming a BEOL capacitor element; and
   forming the at least one further capacitor element comprises forming a MOS capacitor element.

10. A method of forming a semiconductor device, the method comprising:
    determining a total capacitance value for a circuit element of the semiconductor device;
    selecting a capacitance value for each of a plurality of capacitor elements, wherein a parallel combination of the plurality of capacitor elements will obtain the total capacitance value;
    selecting a different process to form each of the plurality of capacitor elements, such that a process tolerance of the total capacitance value is lessened relative to a process tolerance of each different process alone;
    forming each of the plurality of capacitor elements using the respective different process, wherein each of the different processes exhibit uncorrelated process fluctuations with respect to each other; and
    coupling the plurality of capacitor elements in parallel, wherein the plurality of capacitor elements are fixed capacitor elements.

11. The method of claim 10, wherein the plurality of capacitance elements comprises at least two BEOL capacitor elements of different types and at least one MOS capacitor element.

12. The method of claim 10, wherein the plurality of capacitor elements comprises at least one BEOL capacitor element and a plurality of MOS capacitor elements, wherein at least one of the plurality of MOS capacitor elements is formed with a different oxide material type from another one of the plurality of MOS capacitor elements.

13. The method of claim 10, further wherein the step of selecting the different process further comprises selecting a different process to form each of the plurality of capacitor elements, such that a process tolerance of the total capacitance value is minimized relative to a process tolerance of each different process alone.

14. The method of claim 10, wherein selecting the capacitance value for each of the plurality of capacitor elements comprises selecting each capacitance value to be equal to each other if each different process has a tolerance value equal to a tolerance value of each other different process.

15. The method of claim 10, further comprising forming a useful circuit coupled to the plurality of capacitor elements.

* * * * *